United States Patent [19]

Lucas et al.

[11] Patent Number: 4,670,298

[45] Date of Patent: Jun. 2, 1987

[54] FLUORESCENT SOLDER PASTE MIXTURE

[75] Inventors: James A. Lucas, Raleigh, N.C.; William P. Trumble, Kanata, Canada

[73] Assignee: Northern Telecom Limited, Montreal, Canada

[21] Appl. No.: 806,479

[22] Filed: Dec. 9, 1985

[51] Int. Cl.$^4$ .................................... B05D 5/12
[52] U.S. Cl. ................................. 427/96; 427/310; 148/23; 148/24; 29/840; 252/301.16
[58] Field of Search .............. 148/23, 24; 427/310, 427/96; 252/301.16; 29/840

[56] References Cited

U.S. PATENT DOCUMENTS

| | | |
|---|---|---|
| 3,139,360 | 6/1964 | Voida. |
| 3,406,285 | 10/1968 | Scorgie et al. |
| 3,962,116 | 6/1976 | Bloching ................ 252/174.25 |
| 4,269,870 | 5/1981 | Boynton ...................... 427/310 |
| 4,298,407 | 11/1981 | Taylor ............................. 148/24 |
| 4,404,237 | 9/1983 | Eichelberger ................. 427/101 |
| 4,457,861 | 7/1984 | DesMarais ...................... 427/96 |
| 4,557,767 | 12/1985 | Hwang ........................... 148/24 |

*Primary Examiner*—John D. Smith
*Assistant Examiner*—Vi Duong Dang
*Attorney, Agent, or Firm*—Schwartz, Jeffery, Schwaab, Mack, Blumenthal & Evans

[57] ABSTRACT

A fluorescent solder paste mixture comprising a fluorescent pigment dispersed in a solder paste is disclosed. The solder paste comprises solder fragments dispersed in a solder flux. A method for making the solder paste mixture and a method for using the solder paste mixture to make a fluorescent solder joint between an electrical component and a circuit board are also disclosed. Use of the fluorescent solder paste mixture facilitates automatic and manual inspection of circuit boards during and after assembly.

14 Claims, No Drawings

FLUORESCENT SOLDER PASTE MIXTURE

BACKGROUND OF THE INVENTION

This invention relates generally to a solder paste mixture which is easily detectable and more particularly to a solder paste mixture which fluoresces under ultraviolet illumination.

Solder pastes comprising solder fragments dispersed in a solder flux are commonly used in the assembly of circuit boards, particularly those using leadless components. Small quantities of solder paste are applied to metallic solder pads on the circuit board, electrical components are placed on the circuit board such that an electrical contact means contacts the solder paste, and the solder paste is heated to fuse the solder, often by passing the circuit board bearing the solder paste and components through an oven. The circuit board is then allowed to cool so that the solder solidifies, bonding and electrically connecting the electrical components to the solder pads. The surface of the circuit board is then washed to remove the solder flux component of the solder paste which may lead to corrosion if allowed to remain on the completed circuit board.

With automation of the solder paste application, component application, solder fusion and washing operations, automatic inspection of the circuit board at particular stages of its assembly may be desirable. For example, inspection of the circuit board immediately following solder paste application verifies that solder paste has been applied to appropriate locations on the circuit board; inspection of the circuit board immediately following component placement verifies that components have been placed in appropriate locations on the circuit board; and inspection of the circuit board assembly following washing verifies that the solder flux has been removed, and that solder and components are fixed to appropriate locations on the circuit board.

When a fluorescent pigment is dispersed in the solder paste, the solder paste will fluoresce under ultraviolet illumination. The fluorescence increases the contrast between the solder paste and the circuit board or components, facilitating automatic detection of the solder paste. The increased contrast between the solder paste and the components also facilitates automatic detection of component edges which overlap the solder paste. Moreover, if a portion of the pigment disperses in the solder when the solder paste is heated to the melting point of the solder, the pigment will also facilitate automatic detection of the solder following the solder fusion and washing operations. In this case, the contrast will further aid in automatic detection of component edges which overlap the solidifed solder.

Thus, dispersion of a fluorescent pigment in solder paste facilitates automatic inspection of the circuit board for verifying the location of solder paste, verifying the placement of components and verifying the placement of fused and solidified solder. The fluorescent pigment also facilitates automatic detection of solder paste during the component placement operation, when such detection could be used to aid proper placement of the components, and could facilitate automatic detection of solder during solder joint integrity testing.

U.S. Pat. No. 3,139,360 discloses an inspectable soldering flux composition whose presence is detectable in trace amounts in ultraviolet light. This soldering flux composition incorporates an ultraviolet absorbing material which renders the flux readily visible under ultraviolet illumination. The ultraviolet absorbing material is removed with the flux when the flux is washed from a printed circuit board following fusion of the solder. Consequently this solder flux composition aids in the detection of unwanted solder flux residue on printed circuit boards following washing.

U.S. Pat. No. 3,406,285 discloses a method of inspection of soldered joints comprising using a volatile fluorescent dye which, upon heating during soldering to a satisfactory soldering temperature range, will no longer fluoresce during a subsequent inspection. The dye is applied before the soldering operation to the components (such as wires and terminals) to be soldered. If the components are heated to a satisfactory soldering temperature during the soldering operation, no fluorescence will be detected when the components are inspected under ultraviolet illumination. However, if the components do not reach a satisfactory soldering temperature, the dye will fluoresce when the components are inspected under ultraviolet illumination. Consequently, the dye may be used to detect suspect solder joints on printed circuit boards.

The present invention is directed to facilitating the detection of solder paste, fused and solidified solder, and component edges which overlap the solder paste or solder. The methods disclosed in U.S. Pat. Nos. 3,139,360 and 3,406,285 do not address this problem. The materials these patents describe would not be effective in solving the problem addressed by the present invention. The ultraviolet absorbing material of U.S. Pat. No. 3,139,360 would not disperse in the solder during the fusion operation and would be removed from the circuit board with the flux during the washing operation. The volatile dye of U.S. Pat. No. 3,406,285 would lose its fluorescent properties during the fusion operation.

Accordingly, it is an object of this invention to provide a solder paste mixture which fluoresces under ultraviolet illumination and which, after fusion of the solder and removal of the solder flux, yields a solder which fluoresces under ultraviolet illumination.

It is also an object of this invention to provide a method for making this solder paste mixture.

It is another object of this invention to provide a method for making a fluorescent solder joint between an electrical component and a circuit board.

SUMMARY OF THE INVENTION

This invention provides a fluorescent solder paste mixture comprising a fluorescent pigment dispersed in a solder paste, the solder paste comprising solder fragments dispersed in a solder flux, and wherein the fluorescent pigment is 4-methyl-7-diethylamino coumarin.

Preferably, a portion of the fluorescent pigment will disperse in the solder when the solder paste is heated to the melting point of the solder.

This invention also provides a method for making a fluorescent solder paste mixture comprising mechanically mixing a fluorescent pigment with a solder paste, the solder paste comprising solder fragments dispersed in a solder flux, and wherein the fluorescent pigment is 4-methyl-7-diethylamino coumarin.

Further, this invention provides a method for making a fluorescent solder joint between an electrical component and a circuit board, the method comprising:

(a) applying a solder paste mixture to metallic solder pad on the circuit board, the solder paste mixture comprising a fluorescent pigment dispersed in a solder paste, the solder paste comprising solder fragments dispersed in a solder flux;

(b) placing the electrical component on the circuit board such that electrical contact means on the electrical component contacts the solder paste mixture;

(c) heating the solder paste mixture to fuse the solder;

(d) allowing the solder to cool and solidify; and (e) washing the surface of the circuit board to remove the solder flux;

wherein at least a portion of the fluorescent pigment disperses in the solder upon heating the solder paste to the melting point of the solder.

DETAILED DESCRIPTION

A fluorescent solder paste mixture may be prepared by mechanically mixing a fluorescent pigment with a solder paste so as to disperse the pigment in the solder paste.

The pigment selected must be chemically compatible with the solder, solder pads, circuit board substrate and electrical components.

Preferably, a portion of the pigment should disperse in the solder when the solder paste is heated to the melting point of the solder. This portion of the pigment should not be removed by solvents commonly used to remove the solder flux component of the solder paste. Moreover, the pigment should leave no volatile residue following the fusion and washing operations.

It is evident that the pigment should not significantly degrade the adhesion, heat dissipation and electrical conductivity of the solder, and that the pigment should not decompose so as to lose its fluorescent properties in the intended manufacturing and operating environments.

Preferably, the pigment should not be visible under typical daylight illumination so as to preserve the normal appearance of the solder joint and to prevent color code confusion on subsequent operations. However, the pigment should provide adequate fluorescence for good visibility under illumination from readily available ultraviolet light sources.

When used as described below, the pigment 4-methyl-7-diethylamino coumarin has many of the desirable properties described above. This pigment is manufactured by Day-Glo Color Corporation of Cleveland, Ohio and sold under the trade name "Columbia Blue".

This pigment may be mechanically mixed with type "86-3-35" or type "88-3-40" solder paste made by Alpha Metals, Inc. of Jersey City, N.J., to form a solder paste mixture in which the pigment is dispersed in the solder paste. These types of solder paste contain fragments of solder which is approximately 43% tin, 43% lead and 14% bismuth.

A concentration of approximately 0.05% by weight of this pigment in the solder paste makes the solder paste mixture readily visible when illuminated by a 366 nm wavelength UVL 21 light source manufactured by UV Products, Inc. of San Gabriel, Calif. The fluorescence of the solder paste mixture is noticably reduced if the concentration of the pigment is reduced to 0.005% by weight. No degradation of the shear strength of the fused and solidified solder was observed for pigment concentrations as high as 0.2% by weight in the solder paste mixture.

The solder in the solder paste mixture may be fused by heating a circuit board on which the solder paste mixture has been deposited to a temperature of approximately 200° C. for approximately 30 to 45 seconds either on a hot plate or in a convection oven. Alternatively, the circuit board bearing the solder paste mixture may be heated for approximately 15 seconds in an infrared oven to fuse the solder. While heating of the solder paste mixture according to the above directions may cause some fading of the fluorescence observed under 366 nm wavelength illumination, the contrast is adequate for easy detection of the fused solder.

Moreover, the fluorescence does not fade significantly when the fused solder is washed in solvents such as 1,1,1-trichlorethane or trichlorotrifluoroethane (the latter available from Dupont de Nemours of Wellington, Del. under the trade name Freon TF or, with 5.7% methanol and stabilizer added, under the trade name Freon TMS).

The solder paste mixture may be used to bond electrical components to a circuit board by:

(1) applying the solder paste mixture to appropriate metallic solder pads on the circuit board by manual or automated means;

(2) placing the electrical components at appropriate locations on the circuit board by manual or automated means, such that electrical contacts on the components contact the solder paste;

(3) heating the solder paste mixture to approximately 200° C. for approximately 30 to 45 seconds by placing the circuit board on a hot plate or in an oven;

(4) allowing the solder to cool and solidify; and (5) washing the circuit board with 1,1,1-trichlorethane, Freon TF or Freon TMS to remove the solder flux.

In the above process, the circuit board may be illuminated by 366 nm wavelength light and scanned by automated inspection systems to verify the location of solder paste between steps (1) and (2), to verify the location of component edges which overlap the solder paste between steps (2) and (3), and to verify the location of solder and component edges which overlap the solder after step (5). Moreover, the fluorescence of the solder paste may be used to facilitate alignment during the placement operation of step (3).

It is understood that the above description is merely exemplary and not in limitation of the invention as claimed below.

What is claimed is:

1. A fluorescent solder paste mixture comprising a fluorescent pigment dispersed in a solder paste, the solder paste comprising solder fragments dispersed in a solder flux, wherein at least a portion of the fluorescent pigment disperses in the solder upon heating solder paste to the melting point of the solder.

2. A fluorescent solder paste mixture comprising a fluorescent pigment dispersed in a solder paste, the solder paste comprising solder fragments dispersed in a solder flux, wherein at least a portion of the fluorescent pigment disperses in the solder upon heating solder paste to the melting point of the solder, and wherein the fluorescent pigment is 4-methyl-7-diethylamino coumarin.

3. The fluorescent solder paste mixture of claim 2 wherein the 4-methyl-7-diethylamino coumarin between about 0.005% and 0.2% by weight of the solder paste mixture.

4. The fluorescent solder paste mixture of claim 3 wherein the 4-methyl-7-diethylamino coumarin is approximately 0.05% by weight of the solder paste mixture.

5. The fluorescent solder paste mixture of claim 1 wherein the solder comprises approximately 43% tin, 43% lead and 14% bismuth.

6. A method for making a fluorescent solder joint between an electrical component and a circuit board, the method comprising:
   (a) applying a solder paste mixture to a metallic solder pad on the circuit board, the solder paste mixture comprising a fluorescent pigment dispersed in a solder paste, the solder paste comprising solder fragments dispersed in a solder flux;
   (b) placing the electrical component on the circuit board such that electrical contact means on the electrical component contacts the solder paste mixture;
   (c) heating the solder paste mixture to fuse the solder;
   (d) allowing the solder to cool and solidify; and
   (e) washing the surface of the circuit board to remove the solder flux;
   wherein at least a portion of the fluorescent pigment disperses in the solder when upon heating the solder paste to the melting point of the solder.

7. A method for making a fluorescent solder paste mixture comprising mechanically mixing a fluorescent pigment with a solder paste, the solder paste comprising solder fragments dispersed in a solder flux, and wherein the fluorescent pigment is 4-methyl-7-diethylamino coumarin.

8. The method of claim 6 wherein the fluorescent pigment is 4-methyl-7-diethylamino coumarin.

9. The method of claim 6 wherein the 4-methyl-7-diethylamino coumarin comprises between about 0.005% and 0.2% by weight of the solder paste mixture.

10. The method of claim 8 wherein the 4-methyl-7-diethylamino coumarin comprises between about 0.005% and 0.2% by weight of the solder paste mixture.

11. The method of claim 9 wherein the 4-methyl-7-diethylamino coumarin is approximately 0.05% by weight of the solder paste mixture.

12. The method of claim 10 wherein the 4-methyl-7-diethylamino coumarin is approximately 0.05% by weight of the solder paste mixture.

13. A method for making a fluorescent solder paste mixture comprising mechanically mixing a fluorescent pigment with a solder paste, the solder paste comprising solder fragments dispersed in a solder flux, wherein the solder comprises approximately 43% tin, 43% lead and 14% bismuth.

14. The method of claim 6 wherein the solder comprises approximately 43% tin, 43% lead and 14% bismuth.

* * * * *